(12) United States Patent
Meninger

(10) Patent No.: US 7,605,658 B2
(45) Date of Patent: Oct. 20, 2009

(54) RESISTIVELY LOADED SINGLE STAGE DIFFERENTIAL AMPLIFIER HAVING ZERO VOLT COMMON MODE INPUT

(75) Inventor: Scott Meninger, Lancaster, MA (US)

(73) Assignee: Cavium Networks, Inc., Mountain View, CA (US)

( * ) Notice: Subject to any disclaimer, the term of this patent is extended or adjusted under 35 U.S.C. 154(b) by 45 days.

(21) Appl. No.: 11/849,122

(22) Filed: Aug. 31, 2007

(65) Prior Publication Data

US 2009/0058529 A1   Mar. 5, 2009

(51) Int. Cl.
    *H03F 3/45*   (2006.01)
(52) U.S. Cl. .................. 330/261; 330/253
(58) Field of Classification Search ............ 330/261, 330/253, 254, 258
    See application file for complete search history.

(56) References Cited

U.S. PATENT DOCUMENTS

| | | | |
|---|---|---|---|
| 5,376,937 A | 12/1994 | Colleran et al. | |
| 5,844,442 A * | 12/1998 | Brehmer | 330/258 |
| 6,018,267 A | 1/2000 | Tran et al. | |
| 6,480,065 B1 | 11/2002 | Herrera et al. | |
| 6,624,697 B2 * | 9/2003 | Taylor | 330/258 |
| 6,924,702 B2 * | 8/2005 | Chen | 330/253 |
| 7,075,473 B2 | 7/2006 | McGowan | |
| 7,349,681 B2 * | 3/2008 | Ou | 455/343.1 |
| 7,358,813 B2 * | 4/2008 | Onishi | 330/258 |
| 2002/0196172 A1 | 12/2002 | Bult | |

* cited by examiner

*Primary Examiner*—Henry K Choe
(74) *Attorney, Agent, or Firm*—Hamilton Brook Smith & Reynolds, P.C.

(57) ABSTRACT

A resistively folded single stage differential amplifier capable of accommodating a low input common mode without impacting the performance of a bias current source, while also providing a high input impedance to allow for the use of the linear termination resistors. The differential amplifier provides an amplified output signal with a common mode referenced to an upper bound of an input power supply. The differential amplifier includes an input sub-stage and a transistor sub-stage resistively folding the input sub-stage.

16 Claims, 16 Drawing Sheets

300mV DIFFERENTIAL INPUT, 0V COMMON MODE

INVENTIVE DESIGN

PRIOR ART

300mV DIFFERENTIAL INPUT, 0V COMMON MODE, +/-150mV COMMON MODE NOISE

600mV DIFFERENTIAL INPUT, 0V COMMON MODE INPUT

600mV DIFFERENTIAL INPUT, 0V COMMON MODE, +/-150mV COMMON MODE NOISE

RESISTIVELY LOADED SINGLE STAGE DIFFERENTIAL AMPLIFIER HAVING ZERO VOLT COMMON MODE INPUT

BACKGROUND

A differential amplifier is a type of electronic amplifier that may multiply the difference between two inputs by some constant factor, often referred to as a differential gain. A differential amplifier may typically be used as an input stage for operational amplifiers or current mode (emitter or source coupled) logic gates.

SUMMARY

A single stage differential amplifier design, and method for providing such, capable of accommodating a low input common mode is presented. The differential amplifier may comprise an input sub-stage configured to accommodate a zero volt common mode input and provide a high input impedance. The differential amplifier may also comprise a transistor sub-stage resistively folding the input sub-stage resulting in a single stage, the transistor sub-stage configured to provide an output signal with a common mode referenced to an upper bound of an input power supply.

The input sub-stage of the differential amplifier may further comprise a pair of input transistors and a third transistor configured to supply a bias current. The pair of input transistors and the third transistor may be p-channel MOS transistors. The pair of input transistors may be configured to accommodate the zero volt common mode without impacting the performance of the third transistor. The single stage amplifier may also include at least two resistors configured to supply a resistive load.

The transistor sub-stage of the differential amplifier may further comprise a plurality of n-channel MOS transistors configured to supply a second biasing current source. The transistor sub-stage may resistively load the input sub-stage, forming the single stage, due to the resistive load configured to supply a bias current to the transistor sub-stage, thereby, the bias current may have a direct affect on the output signal.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

Figure 1:
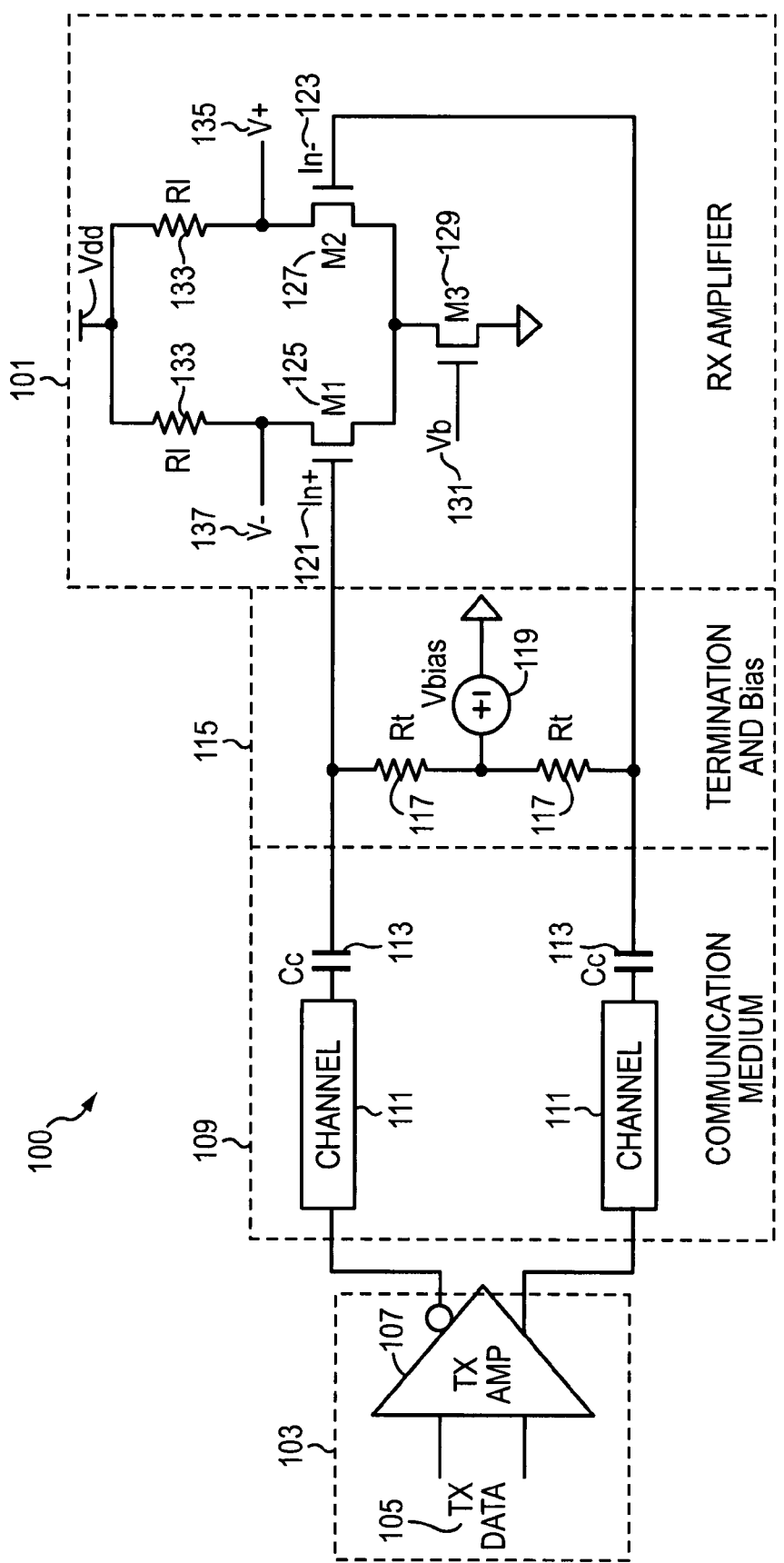
FIGS. 1-4 illustrate examples of differential amplifier configurations.

FIG. 1 shows a standard high speed communications system 100 featuring serial data receiver including a differential amplifier 101. Shown in FIG. 1, for reference, is a transmitter 103 used for transmitting data 105 via a transmitting amplifier 107, as well as a communication medium 109 featuring data channels 111 and coupling capacitors 113 that make up the serial link.

A voltage input is provided to the differential amplifier 101 via a termination and bias section 115 of the receiver. The termination and bias section 115 features termination resistors $R_t$ 117 and a bias voltage $V_{bias}$ 119. The termination resistors $R_t$ 117 may be used to terminate the data transmission line in order to prevent reflections, while the bias voltage $V_{bias}$ 19 may be used as in input to the differential amplifier 101 in a manner allowing the operation of the differential amplifier 101 to remain in an active, or linear, region.

In order to satisfy high speed serial link requirements for a linear termination resistance over a broad frequency range at the receiver, while simultaneously generating a valid bias voltage for the differential amplifier 101 inputs, the biasing voltage $V_{bias}$ 119 is typically configured as a small signal ground to the link termination resistors $R_t$ 117. Therefore, the biasing voltage $V_{bias}$ 119 is generated in a manner to allow for a low enough impedance to act as a small signal ground.

The biasing voltage $V_{bias}$ 119 is supplied to a pair of input transistors $M_1$ 125 and $M_2$ 127, generally consisting similar operational properties, as non-inverting 121 and inverting 123 inputs, respectively, of the differential amplifier 101. The sources of the two transistors $M_1$ 125 and $M_2$ 127 are interconnected with a constant current source provided by a transistor $M_3$ 129. The transistor $M_3$ 129 is powered by a constant voltage $V_b$ 131 and is configured to provide a constant bias current in a manner allowing the differential amplifier to operate in a stable mode. The differential amplifier 101 also includes a resistive load consisting of two resistors $R_L$ 133 configured to supply both a non-inverting $V_+$ 135 and an inverting $V_-$ 137 output.

In order for the differential amplifier 101 of FIG. 1 to generate a useful output, $V_{bias}$ 119 must be configured to satisfy biasing requirements while supporting the required differential input. The non-inverting 121 and inverting 123 inputs must be of the proper differential amplitude to successfully cause the amplifier output to toggle. The differential mode voltage (DM signal) is a measure of the identical and inverted input signals defined by the equation ($V_+$−$V_-$). The minimum differential amplitude (DM signal) that will cause the amplifier to produce an output of a desired amplitude is referred to as the receiver sensitivity. The average value of the non-inverting 121 and inverting 123 input signals, also known as the common-mode voltage signal, must be high enough to bias the amplifier into its active region of operation. The common-mode voltage is a measure of identical signal components on both the inverting and non-inverting inputs of the differential amplifier, defined by the equation $V_{bias}=(V_+ +V_-)/2$. If the average value (CM signal) of the inputs is too low, the amplifier output will become distorted and un-usable. Additionally, if the minimum voltage at either positive or negative input drops a significant amount below the established common mode as a result of the differential component of the signal, the amplifier output may become distorted. This requires that the common mode voltage no only include considerations for biasing the amplifier, but also for accommodating the required differential input swing.

Generation of the biasing voltage $V_{bias}$ 119 is non-trivial and potentially involves the expenditure of significant chip area and power. Not only is it necessary for $V_{bias}$ 119 to satisfy the two criteria, $V_{bias}$ must also be of a low enough impedance to act as a small signal ground in order to the link termination resistors $R_t$. The requirement for a small signal ground at the biasing voltage $V_{bias}$ 119 node is to satisfy high speed serial link requirements for a linear termination resistance, over a broad frequency range at the receiver.

Furthermore, some high speed serial data standards require that $V_{bias}=0V$. A zero volt common mode specification precludes the use of the amplifier shown in FIG. 1, which is incapable of supporting such a low common mode voltage. A low common mode voltage employed in the differential amplifier of FIG. 1 will produce a distorted output signal. For the transistor $M_3$ to operate in its saturation region, as is desired for high speed operation, its drain-to-source voltage ($V_{ds}$) must be greater than its gate-to-source voltage ($V_{gs}$) minus its threshold voltage ($V_t$). In order to determine the value of $V_{bias}$ that results in this condition the operating points of the input transistors $M_1$ and $M_2$ must also be considered. Given that the input transistors $M_1$ and $M_2$ have the same operating requirements, the low voltage input common mode limit of the amplifier, in order to ensure a linear mode of operation, may be represented by the following equation:

$$V_{bias} > (V_{gs}-V_t)_{M_3} + (V_{gs}-V_t)_{M_1} + (V_t)_{M_1} \quad [1]$$

where $V_{gs}$ is the voltage drop between the gate and source terminals, and $V_t$ is the threshold voltage, of the respective transistors. The value of the right hand side of equation [1] is clearly greater than zero, therefore if $V_{bias}=0V$ the low voltage common mode voltage limit would be exceeded. Thus, once the common mode limit condition is violated, the bias current through $M_3$ will differ from its set-point, and the output signal of the differential amplifier will become distorted. Furthermore, at a low enough value of $V_{bias}$, the current source $M_3$, in the differential amplifier of FIG. 1, will likely shut off. Thus, the architecture depicted in FIG. 1 only finds use in serial link standards that do not require a zero or near zero volt common mode at the receiver.

Figure 2:
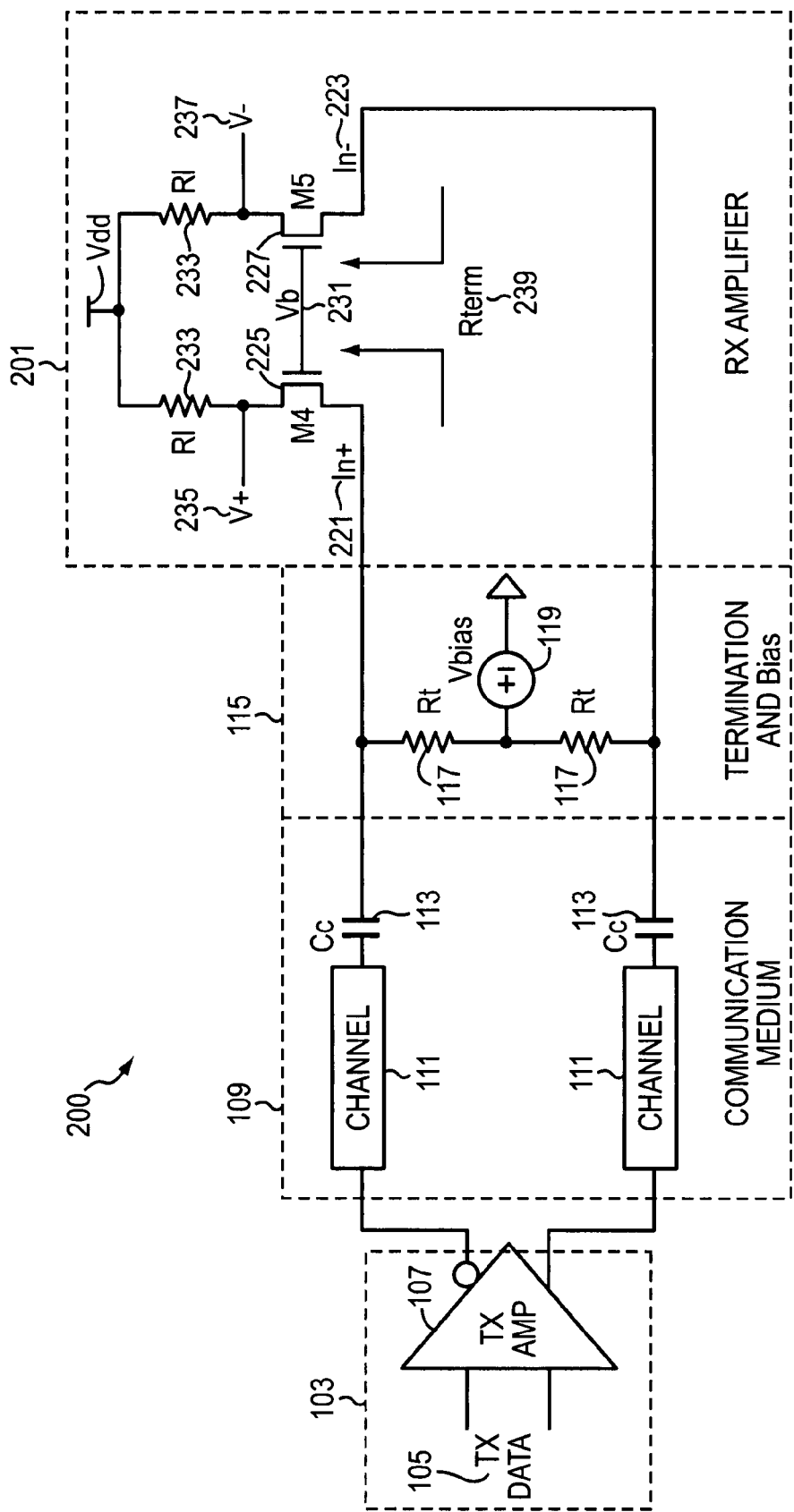

FIG. 2 provides an alternative configuration 200 of the differential amplifier shown in FIG. 1, attempting to satisfy the requirement of a zero volt common mode voltage. For simplicity, the transmitter and receiver of FIG. 2 includes the transmitting portion 103, the communication medium 109, and the termination and bias section 115 of FIG. 1. In the differential amplifier 201 of FIG. 2, the receiver input stage consists of two input transmitters, $M_4$ 225 and $M_5$ 227, in a common gate configuration and supplied a constant voltage $V_b$ 231. The common gate configuration forms a low input impedance $R_{term}$ 239 equal to 1/gm, where gm is the device trans-conductance. The biasing voltage $V_{bias}$ 119 is configured to supply a non-inverting 221 and inverting input 223 to the emitters of the input transmitters $M_4$ 225 and $M_5$ 227, respectively. The differential amplifier 201 also includes a resistive load consisting of two resistors $R_L$ 233 configured to supply a non-inverting output $V_+$ 235 and an non-inverting output $V_-$ 237.

If a low common gate voltage $V_b$ (essentially equal to zero volts) is applied, the differential amplifier 201 of FIG. 2 may be able to accommodate a zero volt common mode when proper bias conditions are applied. However, the zero volt common mode accommodation comes at the cost of a well-defined input impedance.

In common gate configurations, the resistance presented by the amplifier appearing in parallel with the desired termination resistance is equal to 1/gm. For a 50Ω termination resistor, this implies at 1/gm>5 kΩ, or gm<200 μs in order for the total parallel combination to not vary from the desired termination value by more than 1%. This is a very low transconductance value for a high speed amplifier and therefore implies that the amplifier load resistor be correspondingly large to make up for the low transconductance in order to get any gain out of the amplifier. A higher load resistance directly reduces the bandwidth of the amplifier and is highly undesirable. This tradeoff between having a very precisely terminated input signal by having a large amplifier input impedance (and therefore low bandwidth) versus having a high amplifier bandwidth (and therefore low input impedance that results in poor termination) is highly undesirable.

Recall that the common gate configuration of the two input transmitters $M_4$ 225 and $M_5$ 227 results in a low input impedance $R_{term}$ 239. Due to the low value of the input impedance of the amplifier of FIG. 2 that will vary with process, voltage and temperature; the overall termination impedance $R_t$ 117 is not well controlled and will vary with process, temperature, and input signal swing amplitude. Making $R_{term}$ 239 large enough so that it does not affect the overall value of resistance seen at the end of the link (e.g., formed by the parallel configuration of $R_{term}$ and $R_t$) implies reducing the gain of the amplifier (since increasing $R_{term}$ means reducing gm, which, in turn, reduces amplifier gain equal to gm*$R_L$). To counteract the reduced gain, the resistive load $R_L$ 233 must be increased, but this has the undesirable effect of reducing amplifier bandwidth.

One possible solution is to eliminate $V_{bias}$ 119 and $R_t$ 117, and use $R_{term}$ 239 as the termination resistance. However, there are problems associated with this solution since $R_{term}$ 239 is dependent on MOS characteristics and input swing. This dependence makes it very difficult for $R_{term}$ 239 to meet the strict absolute specifications often required in high speed serial standards. Specifically, DC specifications must be met, which determine the limit on the input resistance that the amplifier presents in parallel with the termination resistance. Any capacitance in parallel with the termination resistance results in a frequency dependent resistance requirement (impedance) in the form of a return loss specification.

For similar reasons, standards requiring a zero volt common mode input will not be able to use the approach of employing $R_{term}$ 239 as the termination resistance. Rather, the architecture of FIG. 2 finds use in links where the input impedance specifications are relaxed, and common mode voltage requirements are unspecified.

It should be noted that high and low impedance values are relative terms. High speed serial data standards almost universally use 100 Ω, for differential inputs, and 50 Ω, for single-ended inputs, as the termination resistance. There is a notion when using "high" or "low" as to whether the impedance in question appears in parallel or in series with the desired resistance. Therefore, any impedance that would appear in parallel to the desired resistance and lowers the total impedance seen at the node in question by a significant amount is considered "low."

Figure 3:
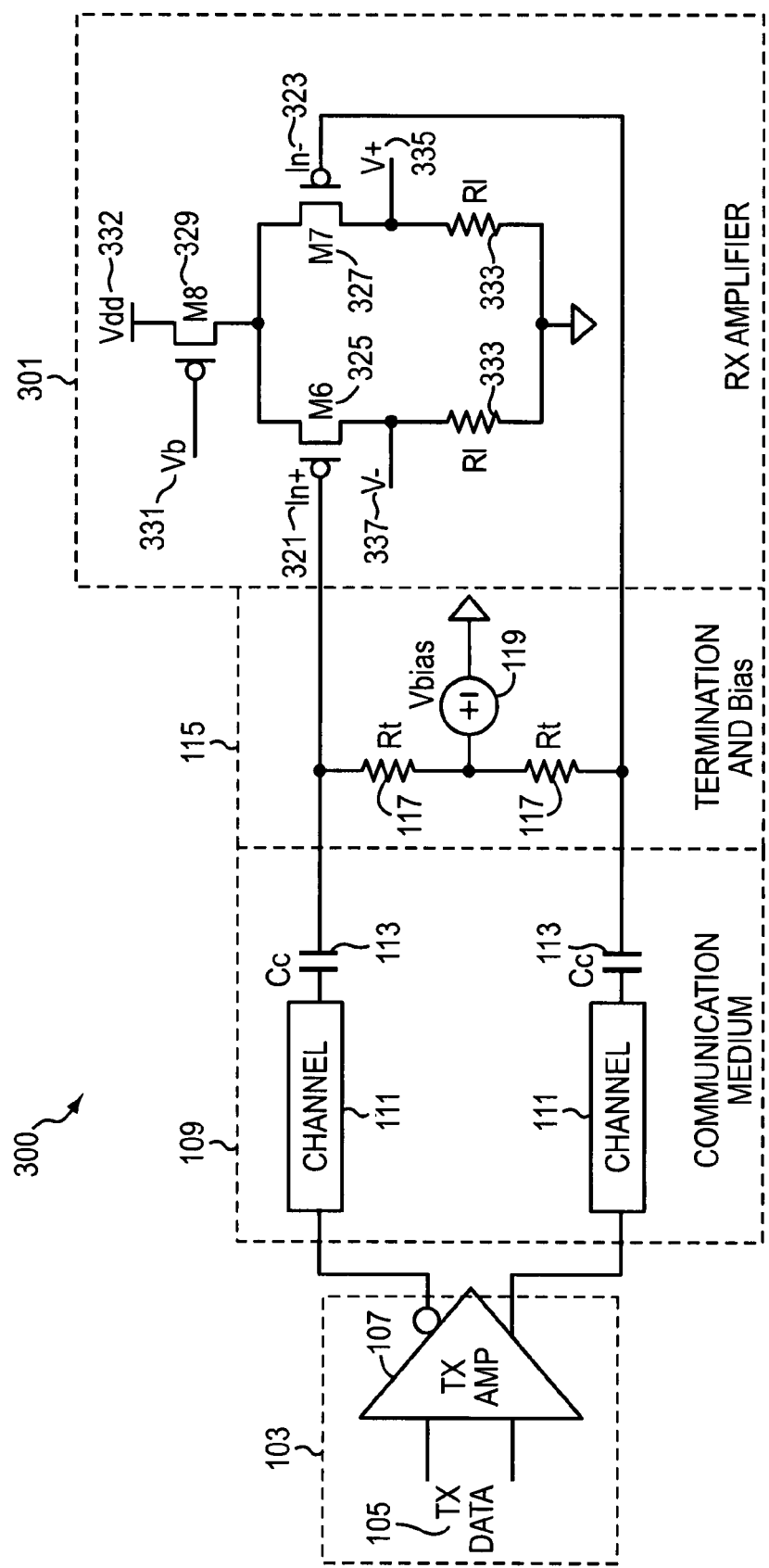

FIG. 3 provides an alternative configuration 300 of the differential amplifier shown in FIG. 2, attempting to provide a high input impedance. For simplicity, the transmitter and receiver of FIG. 3 includes the transmitting portion 103, the communication medium 109, and the termination and bias section 115 of FIG. 1. In the differential amplifier 301 of FIG. 3, a non-inverting 321 and an inverting 323 input signal is supplied to the gate terminals of two input p-channel MOS transistors $M_6$ 325 and $M_7$ 327, respectively. The sources of the two p-channel MOS transistors $M_6$ 325 and $M_7$ 327 are connected and share a constant current source supplied by a third p-channel transistor $M_8$ 329, supplied by a constant voltage source $V_b$ 331. The differential amplifier 301 also includes a resistive load consisting of two resistors $R_L$ 333 configured to supply a non-inverting output $V_+$ 335 and an inverting output $V_-$ 337.

Replacing the n-channel MOS transistors of FIGS. 1 and 2 with p-channel MOS transistors, as shown in FIG. 3, provides a high input impedance, since the input is connected to transistor gates, which are purely capacitive in nature as compared to FIG. 2, where the input is connected to a transistor source and the amplifier input resistance is 1/gm. Since a high input impedance is capable of being established, unlike the differential amplifier configuration of FIG. 2, the differential amplifier 301 may employ the linear resistors $R_t$ for termination, as is desired, while attempting to maintain a zero volt common mode voltage.

However, in contrast to the circuit of FIG. 1, the common mode at the input for this circuit is restricted by the output swing of the amplifier rather than the need to keep the current source $M_8$ 329 biased. In this case, the amplifier is PMOS based, therefore in order determine the lowest common mode allowed, the voltage at which the input transistors $M_6$ 325 and $M_7$ 327 are in a saturation region, is evaluated. The drain-to-source voltage of the input transistors must be greater than the gate-to-source voltage of the transistor minus a threshold value. Because the source is at a higher potential than the drain for a PMOS device, in order for the input transistor to remain saturated, its drain (or maximum value of $V_{output\_swing}$) must be lower than the voltage at its gate ($V_{bias}$) raised by a threshold ($V_t$). Thus, the minimum common mode required to obtain a non-distorted output swing is:

$$V_{bias} > V_{output\_swing} - |(V_t)_{M_6}| \quad [2]$$

where $V_{output\_swing}$ is the voltage swing at the non-inverting $V_+$ 335 and inverting output $V_-$ 337 output nodes. As the output swing is increased, the value of $V_{bias}$ 119 must also be increased in order to keep the amplifier operating properly, as is dictated by equation [2]. In the case where $V_{bias}=0V$ (i.e., a zero volt common mode), the swing on the amplifier, $V_{output\_swing}$, must be less than the threshold voltage, $V_t$, of the input devices ($M_6$ 325 and $M_7$ 327), which may be very small in modern processes.

Thus far only DC bias conditions have been considered. During normal operation, the input swing will add to the constraint on minimum common mode voltage of equation [2]. The lowest voltage present at the input during normal operation is $V_{bias} - V_{input\_swing}$, where $V_{input\_swing}$ is the amplitude of the swing at the input (the maximum value of the input is therefore $V_{bias} + V_{input\_swing}$). Thus, by substituting $V_{bias} - V_{input\_swing}$ for $V_{bias}$ in equation [2], the following equation is obtained:

$$V_{bias} > V_{input\_swing} + V_{output\_swing} - |(V_t)_{M_6}| \quad [3]$$

where $V_{input\_swing}$ is the amplitude of the differential input swing at the non-inverting 321 and inverting 323 input nodes. In order to maintain a zero volt common mode (i.e., $V_{bias}=0V$), equation [3] reveals that the input swing, $V_{input\_swing}$, subtracts from the allowed output swing, $V_{output\_swing}$, of the output signal. The limitation on the output swing, $V_{output\_swing}$, severely limits the usefulness of this amplifier. If $V_{bias}$ is set equal to 0V, equation [3] reduces to:

$$V_{input\_swing} < |(V_t)_{M_6}| - V_{output\_swing} \quad [4]$$

which severely limits the allowed input swing, $V_{input\_swing}$, before the amplifier becomes distorted. In modern CMOS processes, $|(V_t)_{M_6}|$ is typically between 200 mV and 400 mV, therefore, in view of equation [4], only a very small range of input swings, $V_{input\_swing}$, are allowed for reasonable output swings, $V_{output\_swing}$.

An additional difficulty with the differential amplifier 301 of FIG. 3 is that since the non-inverting $V_+$ 335 and inverting $V_-$ 337 outputs are zero volt referenced, the output signal common mode will be closer to zero volts than to the high voltage supply $V_{dd}$ 332. The output of the amplifier in FIG. 3 has a low value of zero volts and a high value of $(I_{bias})(R_L)$, where $I_{bias}$ is the bias current generated by the current source transistor $M_8$. Therefore, if the next stage of the amplifier employs an NMOS type differential input pair, the average value of the output voltage must be risen to properly bias the next stage. Thus, if the output signal mode is closer to zero volts rather than the high voltage supply, level shifters must be used between the amplifier outputs and the next stage in the receiver, if the next stage has NMOS inputs. This will almost always be the case, since the next stage in a serial link will likely be a sampling flip-flop designed with NMOS inputs to save area and power for a given speed. It is possible to employ a next stage which is PMOS based.

Figure 4:
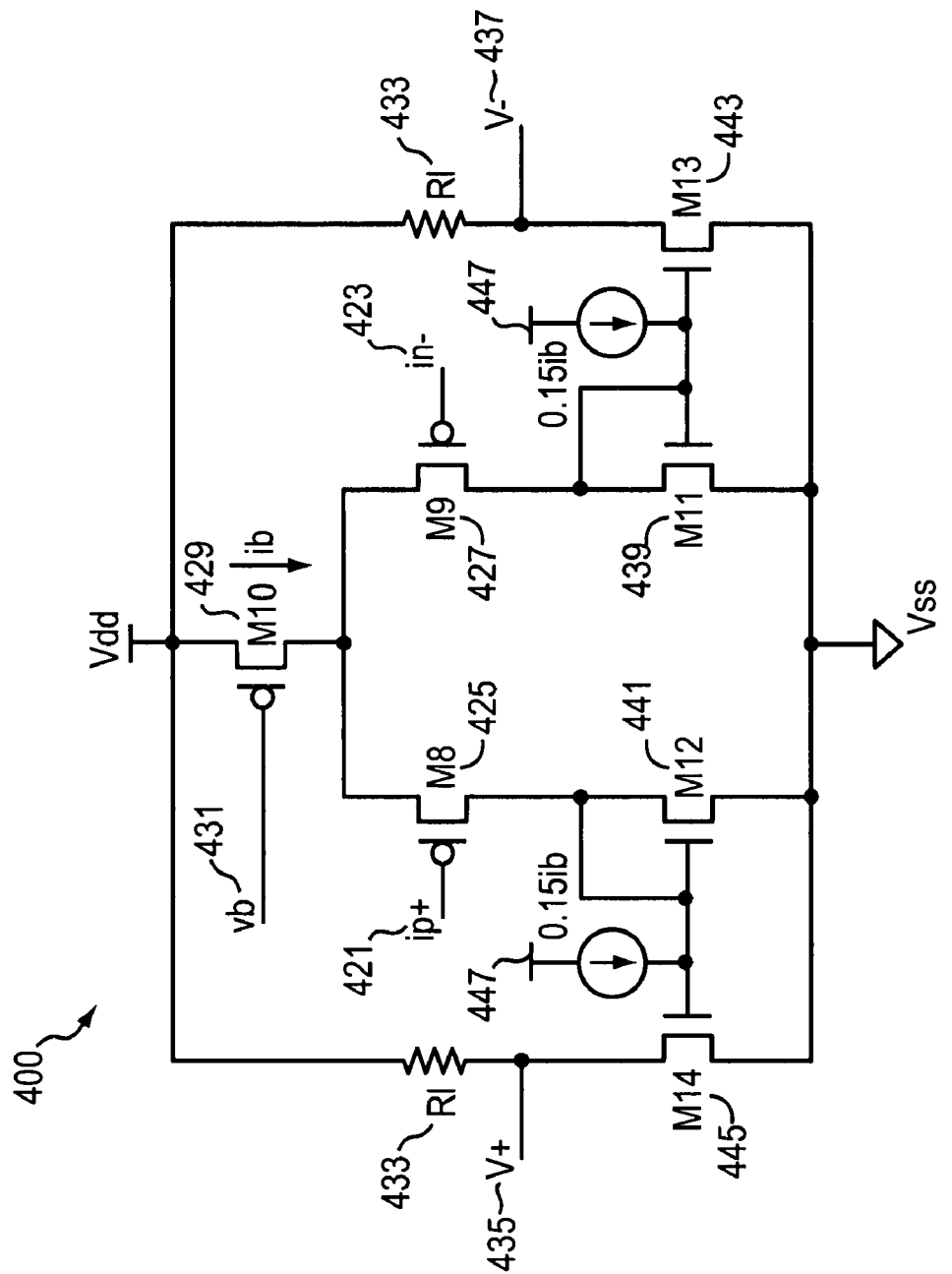

FIG. 4 provides an alternative configuration 400 of the differential amplifier shown in FIGS. 1-3, attempting to accommodate a low input common mode without impacting the performance of the bias current source, while also providing a high input impedance to allow for the use of the linear termination resistors $R_t$. In the differential amplifier 401 of FIG. 4, a non-inverting 421 and an inverting 423 input signal is supplied to the gate terminals of two input p-channel MOS transistors $M_8$ 425 and $M_9$ 427, respectively. The sources of the two p-channel MOS transistors $M_8$ 425 and $M_9$ 427 are connected and share a constant current source supplied by a third p-channel transistor $M_{10}$ 429, supplied by a constant voltage source $V_{b1}$ 431. The differential amplifier 401 also includes a resistive load consisting of two resistors $R_L$ 433 configured to supply a non-inverting output $V_+$ 435 and an inverting output $V_-$ 437.

The differential amplifier uses dioded NMOS transistors $M_{11}$ 439 and $M_{12}$ 441 as a load for the input transistor pair $M_8$ 425 and $M_9$ 427. NMOS transistors $M_{13}$ 443 and $M_{14}$ 445 form a current mirror and that is used in conjunction with the load resistors $R_L$ 433 to achieve an output that is $V_{dd}$ referenced, unlike the differential amplifier of FIG. 3. Since the bias current $I_b$, supplied by the input transistor pair $M_8$ 425 and $M_9$ 427, is steered into the two dioded NMOS transistors $M_{11}$ 439 and $M_{12}$ 441, and since a separate current 447 is used to create the output swing (via NMOS transistors $M_{13}$ 443 and $M_{14}$ 445), the differential amplifier 401 is considered to be a two stage design.

In other words, the bias current from $M_{10}$ is steered by the input devices $M_8$ and $M_9$ to the dioded devices $M_{11}$ and $M_{12}$, forming the first part of the signal path. This differential current is then transformed into a differential voltage by the dioded devices $M_{11}$ and $M_{12}$, in a similar manner in which the resistors $R_L$ of FIG. 3 transform the differential current into a differential voltage. The differential voltage at the gates of $M_{13}$ and $M_{14}$ then create a differential current at their outputs, which is transformed into a differential voltage at the amplifier output by the load resistors $R_L$ 433. Therefore, there is no direct influence on the output voltage created at the load resistors $R_L$ 433 by the current being steered by the input devices. Instead, there is an intermediate current-to-voltage transformation required, thus forming a two stage design. A differential amplifier comprising multiple stages may reduce the speed and increase the complexity of the device.

The biasing condition for the amplifier of FIG. 4 is similar to that of the amplifier of FIG. 3, with the resistor $R_L$ 333 being replaced by dioded NMOS transistors. The replacement of the resistor in turn results in a constricted value of $V_{gs}$ in comparison to the $V_{gs}$ value of the amplifier in FIG. 3

[$V_{gs}=(I_{bias})(R_L)$]. This new value of $V_{gs}$ limits the potential input swing as well as places difficult constraints on the value of $V_{bias}$.

The current sources 447 also degrade the performance of the amplifier 400. As the input to the amplifier 400 changes, the diode connected transistors $M_{11}$ 439 and $M_{12}$ 441 experience changes in their transconductance significant enough to slow the amplifier down and change the internal node voltages in a way that is detrimental to performance. The current sources 447 act to keep the dioded devices $M_{11}$ 439 and $M_{12}$ 441 biased when the bias current from $M_{10}$ is steered from one to the other. Thus, the current sources 447 impacts the performance by requiring increased power and decreased current allowed for signal swing.

Figure 5:
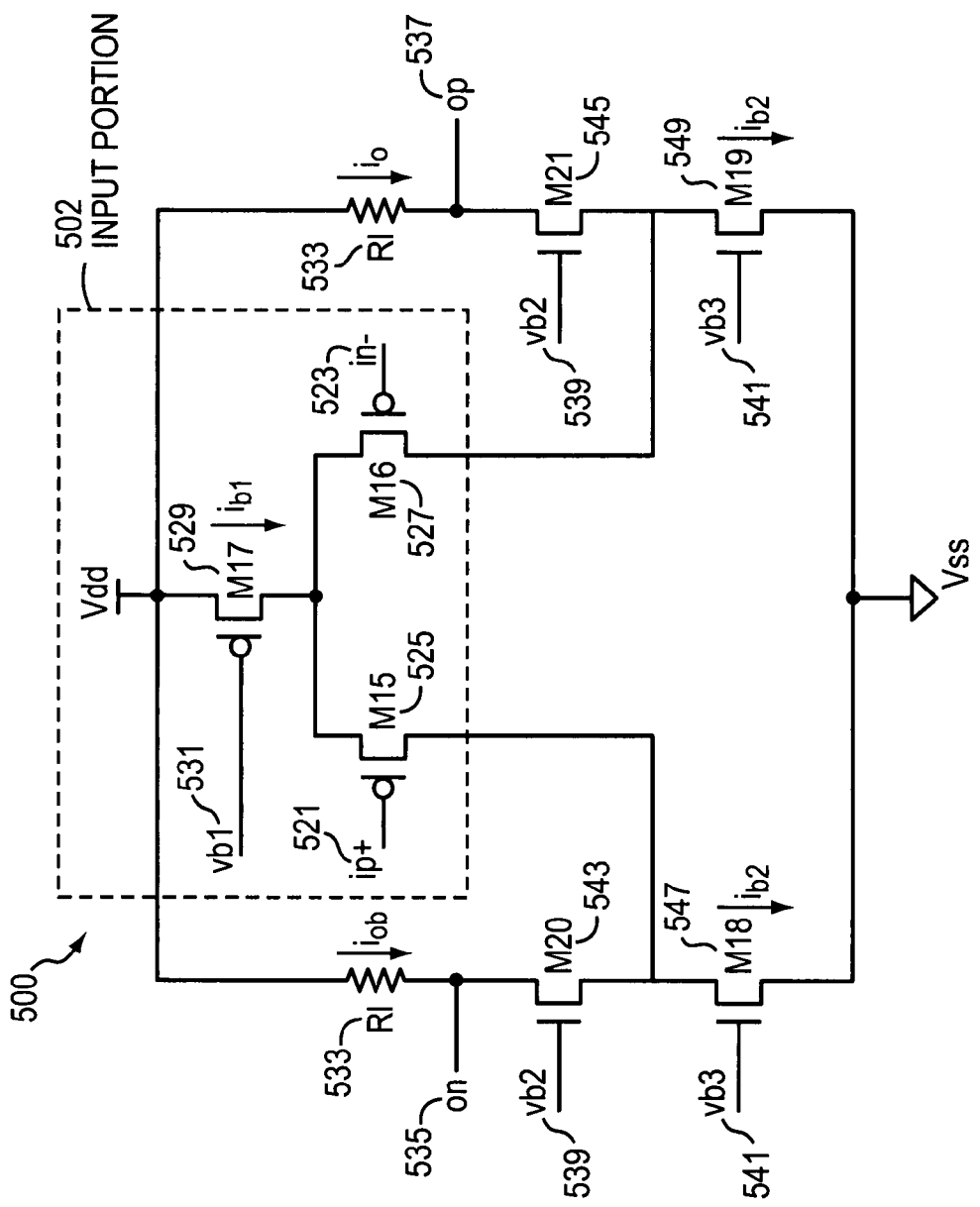
FIGS. 5 and 6 illustrate a differential amplifier configuration according to an embodiment of the present invention.
Figure 6:
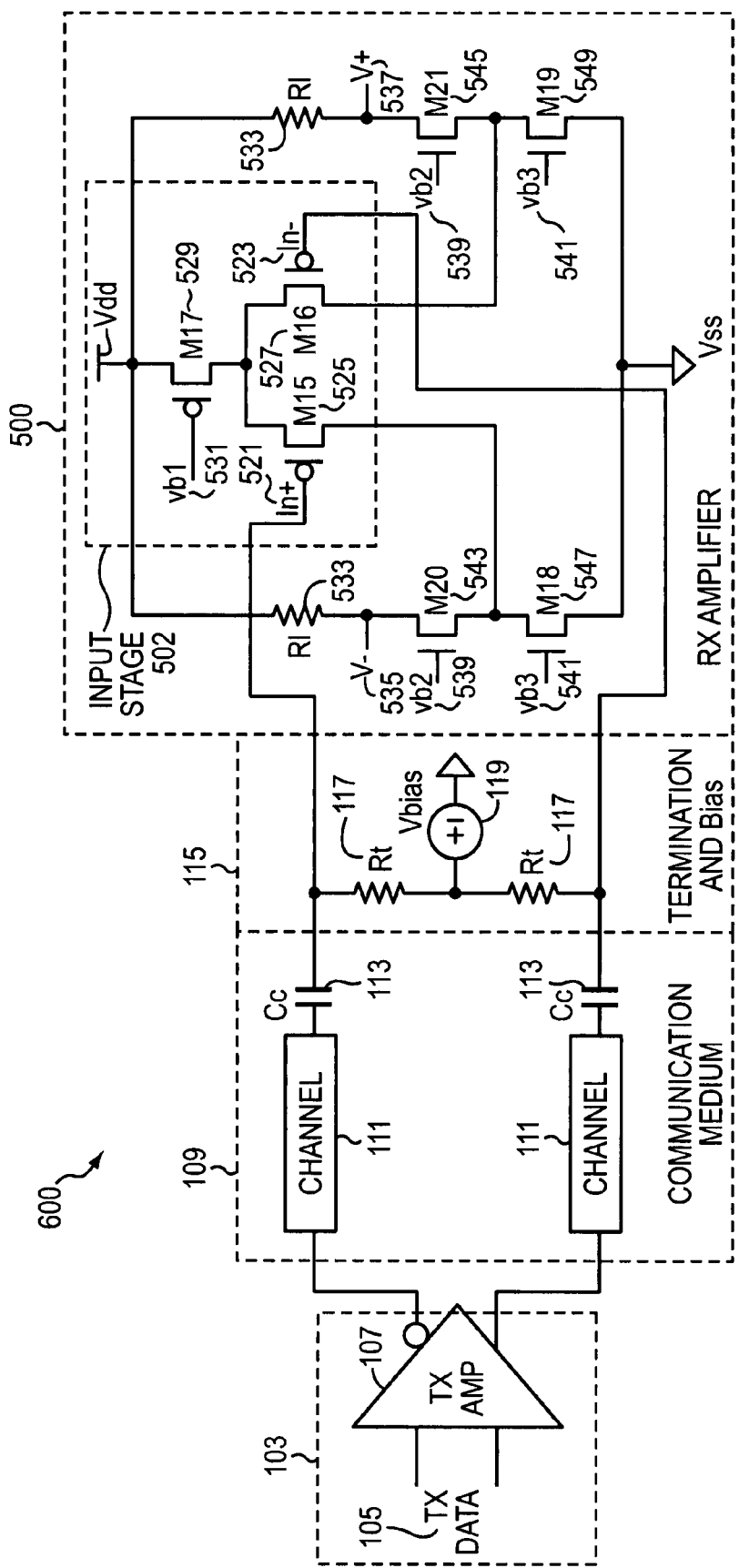

FIGS. 5 and 6 provide a novel configuration 500 of a differential amplifier that provides a single stage solution of accommodating a low input common mode without impacting the performance of the bias current source, while also providing a high input impedance to allow for the use of the linear termination resistors $R_t$ 117. The single stage solution provide a robust and high speed solution to the problems shown in the differential amplifiers of FIGS. 1-4. For completeness, FIG. 6 shows the transmitter and receiver configurations of FIG. 1, including the transmitting portion 103, the communication medium 109 and the termination and bias section 115.

In the differential amplifier 500 of FIGS. 5 and 6, a non-inverting 521 and an inverting 523 input signal is supplied to the gate terminals of two input p-channel MOS transistors $M_{15}$ 525 and $M_{16}$ 527, respectively. The sources of the two p-channel MOS transistors $M_{15}$ 525 and $M_{16}$ 527 are connected and share a constant current source supplied by a third p-channel transistor $M_{17}$ 529, with a voltage source supplying a constant voltage $V_{b1}$ 531 to the transistor $M_{17}$ 529. It should be appreciated that the third p-channel transistor $M_{17}$ 529 may be replaced by two transistors in a cascode configuration configured to supply the constant current source. These elements define the input portion 502 of the differential amplifier 500. The differential amplifier 500 also includes four NMOS transistors $M_{18}$-$M_{21}$ configured to supply a second biasing current source.

The input portion devices, $M_{15}$ 525 and $M_{16}$ 527, are PMOS transistors configured to accommodate a low input common mode without impacting the performance of the bias current source $M_{17}$ 529, while also providing a high input impedance to allow the use of linear termination resistors $R_t$ 117. The differential amplifier 500 further includes a resistive load consisting of two resistors $R_L$ 533 configured to supply a non-inverting output $V_+$ 535 and an inverting output $V_-$ 537. The input portion 502 is resistively folded using NMOS transistor devices $M_{18}$-$M_{21}$ to accommodate a low input common mode without severely restricting the amplitude of the input swing, while also providing a $V_{dd}$ referenced output common mode for use by the next circuitry after the amplifier, allowing these circuits to be NMOS based.

The resistive folding is accomplished by the resistive load $R_L$ 533 supplying proportioned amounts of the biasing current $I_{b1}$ ($I_{ob}$ and $I_o$) directly to the NMOS transistors $M_{20}$ 543 and $M_{21}$ 545, respectively, therefore causing the input signals 521 and 527 to have a direct impact on the output signal. The input bias equation now becomes:

$$V_{bias} > V_{input\_swing} + (V_{gs}-V_t)_{M_{18}} - |V_t|_{M_{15}} \quad [5]$$

$(V_{gs}-V_t)_{M_{18}}$ can be made to be very small, typically 50 mV to 100 mV, as compared to $V_{output\_swing}$ in equation [3] which is typically 200 mV to 400 mV. If $V_{bias}$ is equal to 0V, the condition in equation [5] reduces to:

$$V_{input\_swing} > |V_t|_{M_{15}} - (V_{gs}-V_t)_{M_{18}} \quad [6]$$

which allows for a much larger input swing before the amplifier encounters any distortion, which is a significant difference in comparison to the result of equation [4]. The maximum allowed input swing can be made larger by biasing the current sources $M_{18}$ and $M_{19}$ in the linear region, which would reduce the rightmost term in equation [6], ($V_{gs}-V_t)_{M_{18}}$, even further.

In contrast to the differential amplifier of FIG. 4, the bias current in the amplifier 500 is steered differentially by the two p-channel MOS transistors $M_{15}$ 525 and $M_{16}$ 527 into nodes where it changes the current that ultimately appears across the load resistors $R_L$ 533 at the output nodes. Typically, the load resistors may appear between the input stage device drains and ground. In contrast, in the amplifier of FIG. 5 the load resistors $R_L$ 533 appear between the input stage device drains and the supply $V_{dd}$, thereby allowing an input to have a direct effect on the output of the amplifier. Therefore, the amplifier of FIG. 5 is a one stage design.

In operation, currents $I_{b2}$ flow constantly in each output leg, created by the NMOS transistors $M_{18}$ and $M_{19}$. If a differential input causes all of the bias current to be steered through the PMOS transistor $M_{15}$ and none through the PMOS transistor $M_{16}$, the current though the left output load resistor $R_L$ will equal $I_{ob}=I_{b2}-I_{b1}$, while the current through the right output load resistor will equal $I_o=I_{b2}$. Clearly there is a differential voltage produced as a result, whose value depends directly on the bias current steered by the input, thereby providing a single staged solution where the input signal directly effects the output signal. The NMOS devices $M_{20}$ and $M_{21}$ serve to isolate $M_{15}$-$M_{19}$ from the output voltage swing across the load resistors $R_L$ 533.

Figure 7:
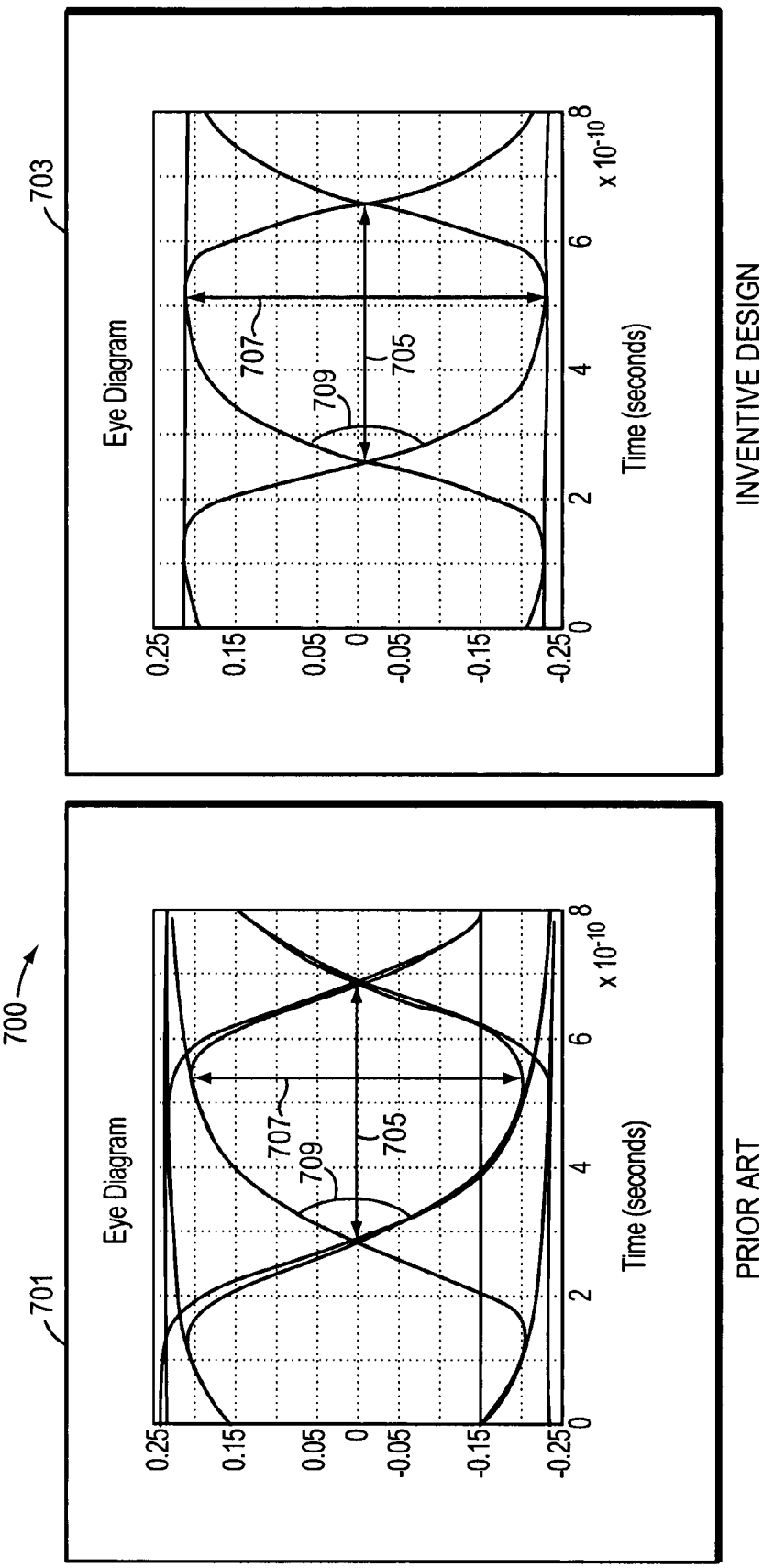
FIGS. 7 and 9-16 illustrate simulation comparisons of the differential amplifier configuration according to FIG. 3 and a differential amplifier configuration according to the embodiment of FIGS. 5 and 6.

To demonstrate the improvements offered by the architecture of FIG. 5, the differential amplifier 500 is compared to the amplifier configuration shown in FIG. 3 in a standard CMOS process. The supply voltage limits for the particular process used are $V_{dd}=1.2V$, $V_{ss}=0V$. FIG. 7 shows simulation results 700 for the differential amplifier shown in FIG. 3 701 and the differential amplifier shown in FIGS. 5 and 6 703, with both the amplifiers designed for the same power dissipation and same output swing. Random data is input into the amplifier and the differential output is observed. The data differential amplitude is 50 mV. The data rate for this example is 2.5 Gb/s. The common mode is zero volts and is constant.

Eye diagrams may be a useful tool in determining various system characteristics. A few system characteristics that may be determined is signal distortion, jitter, and transition time. The eye diagram associated with the differential amplifier of FIGS. 5 and 6 703 displays a larger eye width 705, a larger eye height 707, and a larger eye slope 709 than that of the eye diagram associated with the differential amplifier of FIG. 3. Thus, the eye diagram of the preferred differential amplifier 703 displays an output signal with a significantly less amount of signal distortion than that of the differential amplifier of FIG. 3.

Signal jitter is also a measure of signal quality and is defined as the measure of variance in signal characteristics. A zero jitter indicates that the signal transition, or swing, occurs at exactly the same point in time for each transition. Small eye diagram heights 707 imply a large variance, or jitter, in signal transition times. In a comparison of the eye diagram 701 (displaying an output signal from the differential amplifier 301) and the eye diagram 703 (displaying an output signal from the differential amplifier 500), eye diagram 701 displays a smaller height 707 and thus a larger signal jitter.

Transition time is the rise and fall time that is associated with the signals. Transition times may be measured by using the slope 709 of the transition signals in the eye diagram. A 90° slope implies a rise and fall time of zero. Faster rise and fall times are desired for faster performance. A smaller transition time indicates that the signal is valid for a longer time at the next time period. In a comparison of the eye diagram 701 (displaying an output signal from the differential amplifier 301) and the eye diagram 703 (displaying an output signal from the differential amplifier 500), eye diagram 701 displays a smaller angle or slope 709 and thus a larger transition time.

Figure 8:
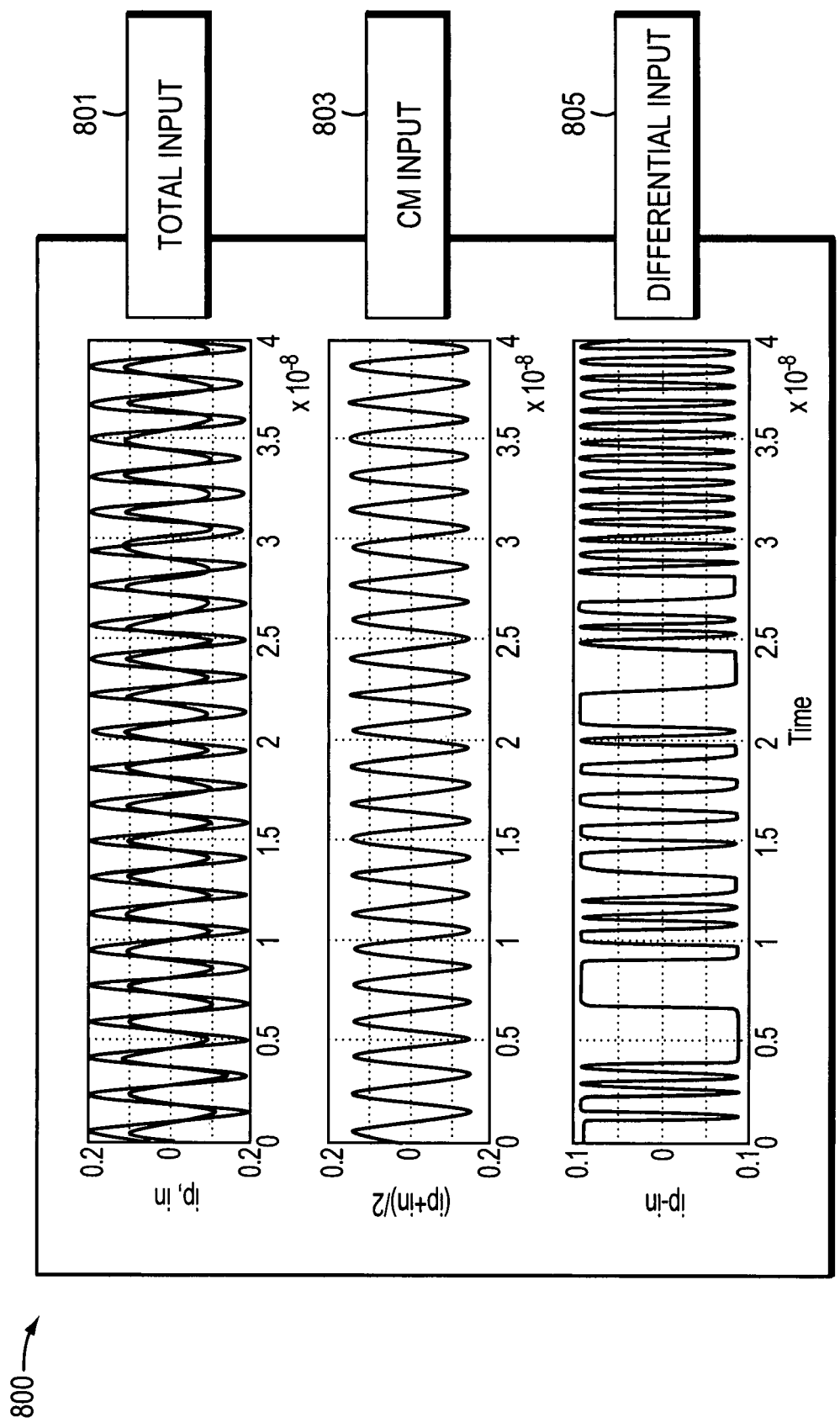
FIG. 8 is a schematic of an example signal used in the simulation comparisons of FIGS. 9-16.

In order to further emphasize the improved performance of the differential amplifier 500 in comparison to the prior art amplifiers, shown in FIGS. 1-4, a varying common mode component is introduced in to the input of the amplifier. FIG. 8 shows a representation 800 of the input signal used in the simulations when common mode is varied. The total input 801 includes of a common mode component (both inputs vary together) and a 50 mV differential input (inputs vary in opposite directions). The common mode data 803, which is the average of the inverting and non-inverting inputs, is centered at zero volts, but the common mode is allowed to vary +/−150 mV around zero, thus introducing noise into the system. Super imposed on the common mode variation is the desired differential signal 805, which is the difference between the inverting and non-inverting inputs. It is the job of the amplifier to amplify the differential portion 803 of the input signal 801, but reject the common mode noise, while tolerating the zero volt average common mode 803. For these simulations the common mode noise frequency is set to roughly ⅕ of the data rate.

Figure 9:
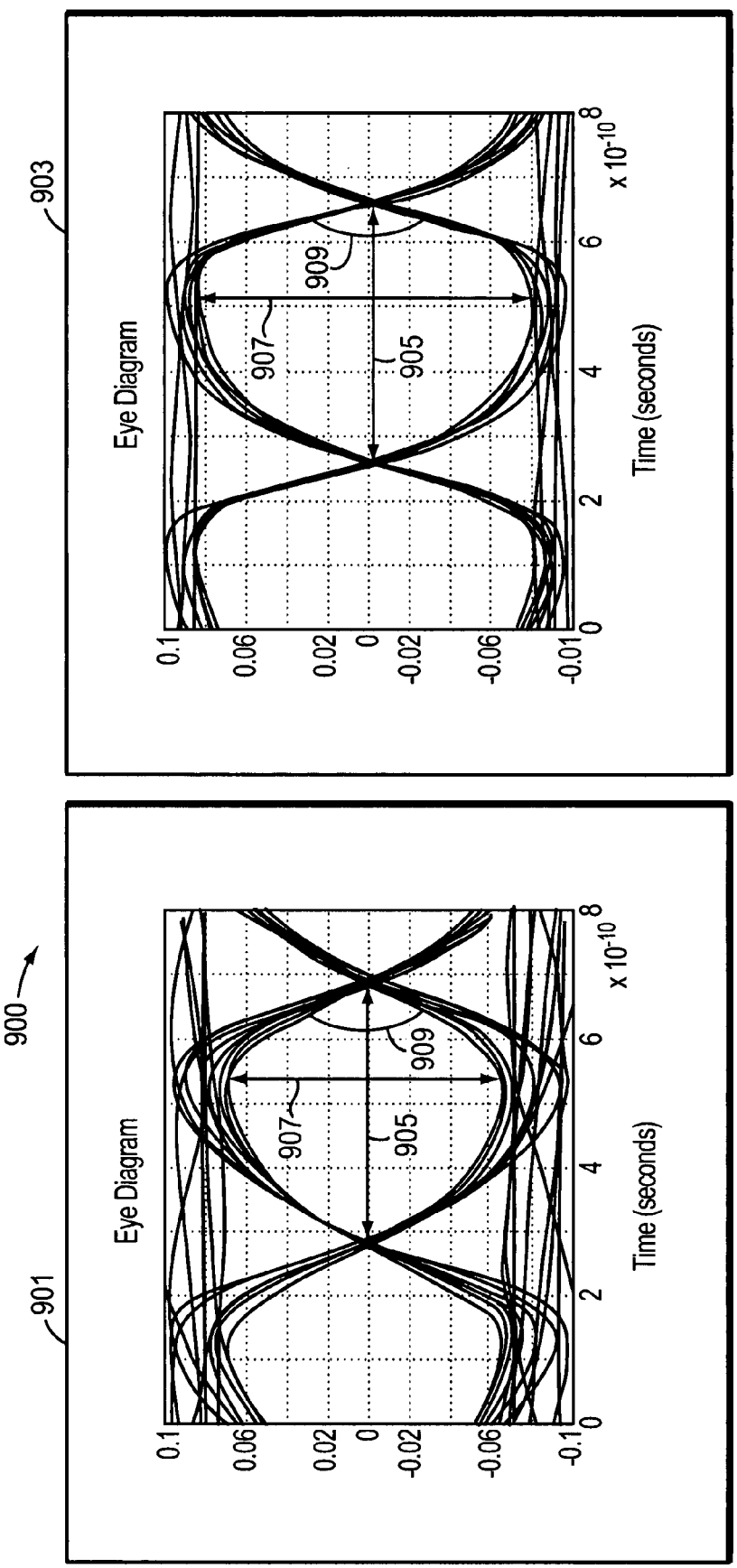

FIG. 9 shows simulation results 900 for the differential amplifiers of FIG. 3 901 and FIGS. 5 and 6 903, both differential amplifiers designed for the same power dissipation and same output swing. The eye diagrams 901 and 903 were obtained using the same 50 mV differential amplitude input of FIG. 8, with a +/−150 mV of common mode noise, and a 500 MHz common mode component. Upon viewing the eye diagram characteristics 905, 907, and 909, both waveforms 901 and 902 display some degree of distortion, but the amplifier of FIGS. 5 and 6 (903) provides a much cleaner, more open eye. Thus, the preferred amplifier of FIGS. 5 and 6 provides an output signal with less distortion, jitter, and improved transition time.

The prior art amplifier 901 has approximately 22 ps of static jitter (change in its zero crossings, or slope 909) while the amplifier of FIGS. 5 and 6 (903) has only 2.5 ps of static jitter. This jitter directly subtracts from the system timing budget and so the approximately 9× improvement with the architecture presented is very significant.

Figure 10:
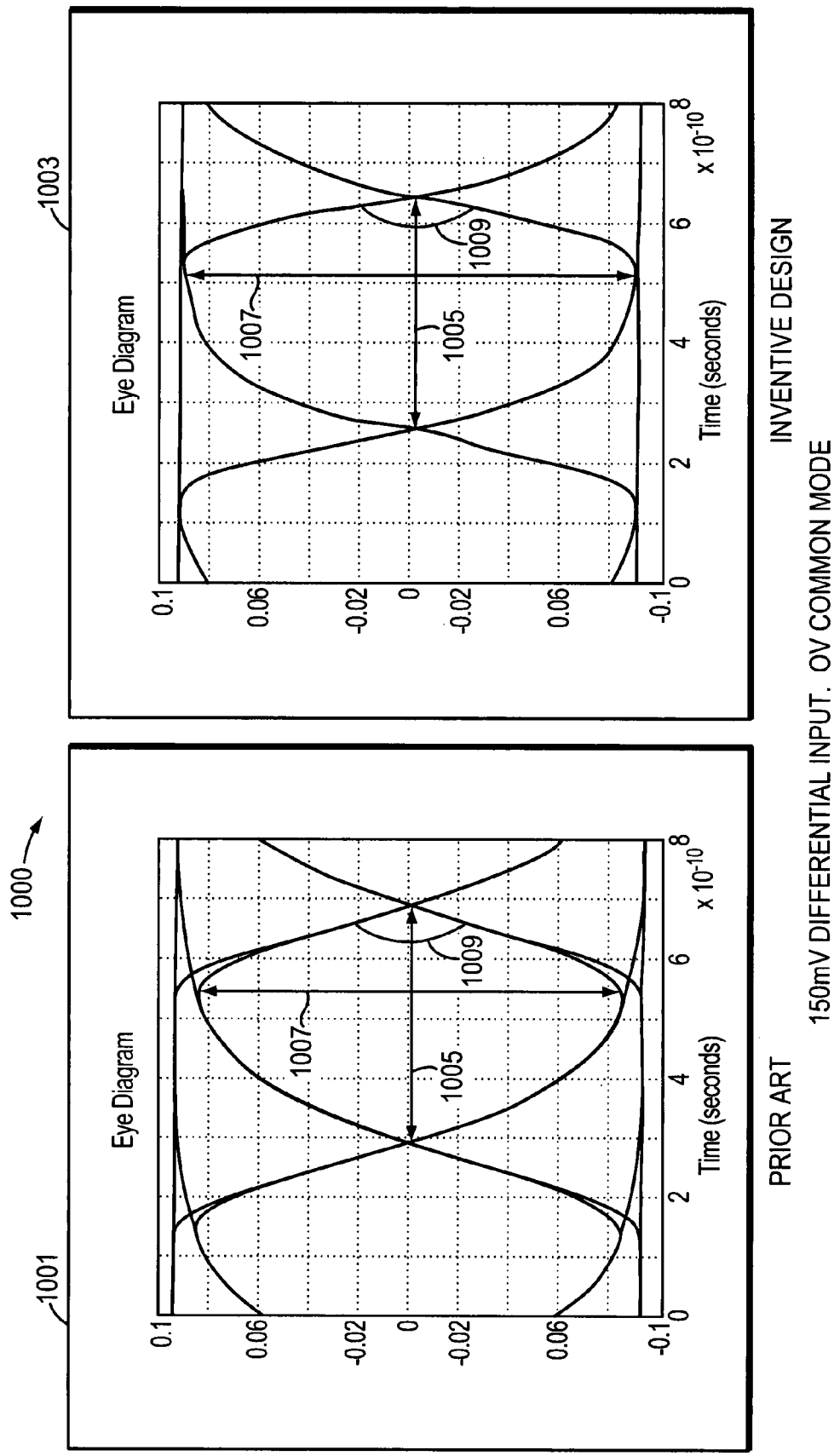

Typically, receiver amplifiers must accommodate a range of input amplitudes. Therefore, to explore the difference between the inventive differential amplifier of FIGS. 5 and 6 and the prior art differential amplifier of FIG. 3 further, eye diagram results obtained with an increased input amplitude is observed. FIG. 10 shows simulation results 1000 for both amplifiers 1001 (differential amplifier of FIG. 3) and 1003 (differential amplifier of FIGS. 5 and 6) with a 150 mV amplitude differential input, and a constant zero volt common mode input. The inventive amplifier 1003 once again results in a much wider eye opening and shows more desirable signal characteristics 1005, 1007, and 1009.

Figure 11:
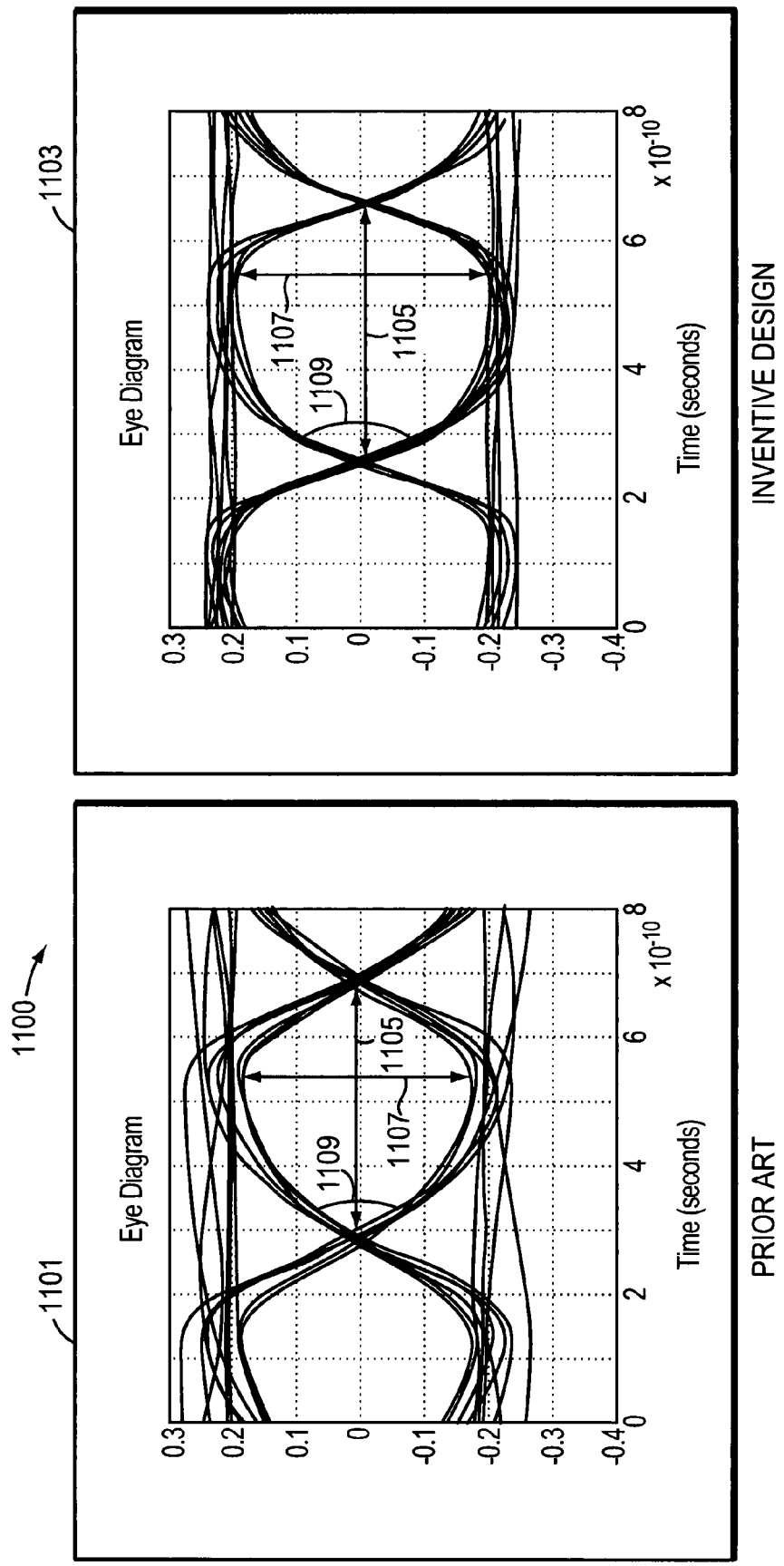

An advantage of the inventive amplifier may become even more clear when common mode noise is included in the input signal. FIG. 11 displays simulation results 1101 (obtained using the differential amplifier of FIG. 3) and 1103 (obtained using the differential amplifier of FIGS. 5 and 6). The simulation results 1101 and 1103 were obtained using the parameters of FIG. 10 (150 mV differential input and a zero volt common mode) and the addition of a +/−150 mV common mode noise. As is shown in FIG. 11, the eye diagram properties 1105, 1107, and 1109 of the differential amplifier 1103 display more desirable signal characteristics than that of the prior art amplifier 1101. The difference in static jitter in FIG. 11 is about 10× (25 ps for prior art, 2.5 ps for the amplifier).

Figure 12:
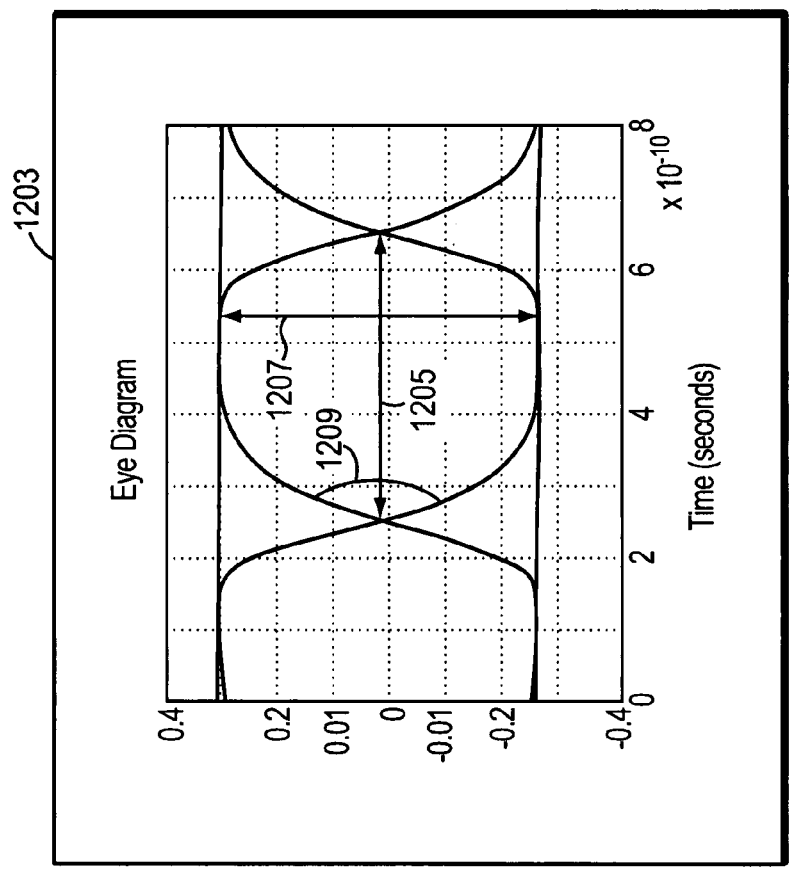
Figure 12:
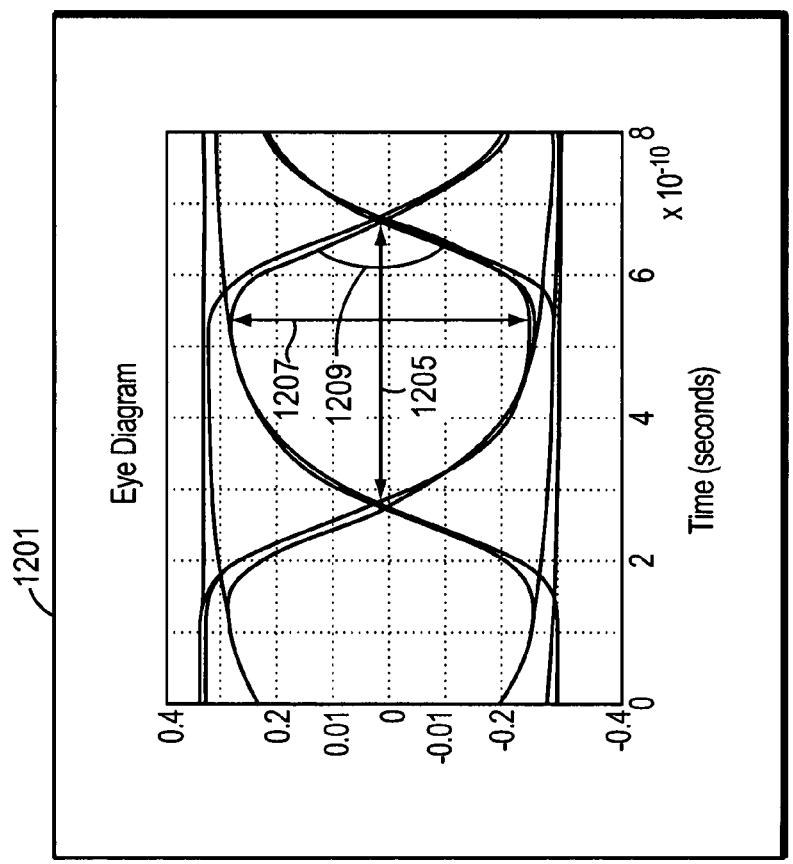

FIG. 12 displays simulation results 1201 (obtained using the differential amplifier of FIG. 3) and 1203 (obtained using the differential amplifier of FIGS. 5 and 6). The simulation results 1201 and 1203 were obtained using an increased differential input of 300 mV and a zero volt common mode. Again, as is shown in FIG. 12, the eye diagram properties 1205, 1207, and 1209 of the differential amplifier 1203 display more desirable signal characteristics than that of the prior art amplifier 1201. The input amplitude is large enough now that it introduces some static jitter in the prior art amplifier 1201, even in the absence of input common mode variation (about 9 ps), while the amplifier 1203 essentially remains static jitter free.

Figure 13:
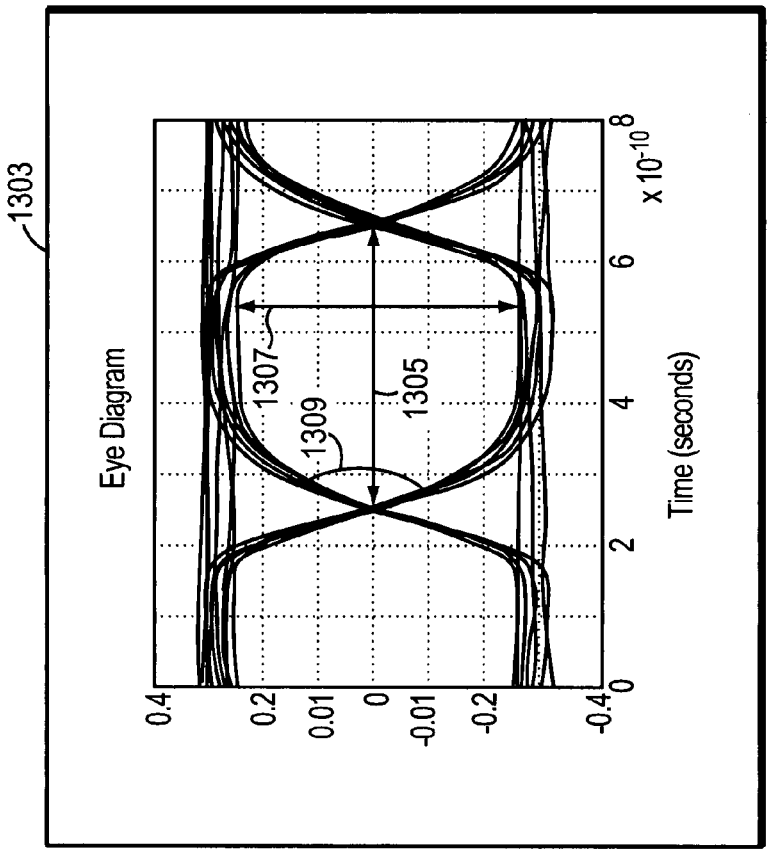
Figure 13:
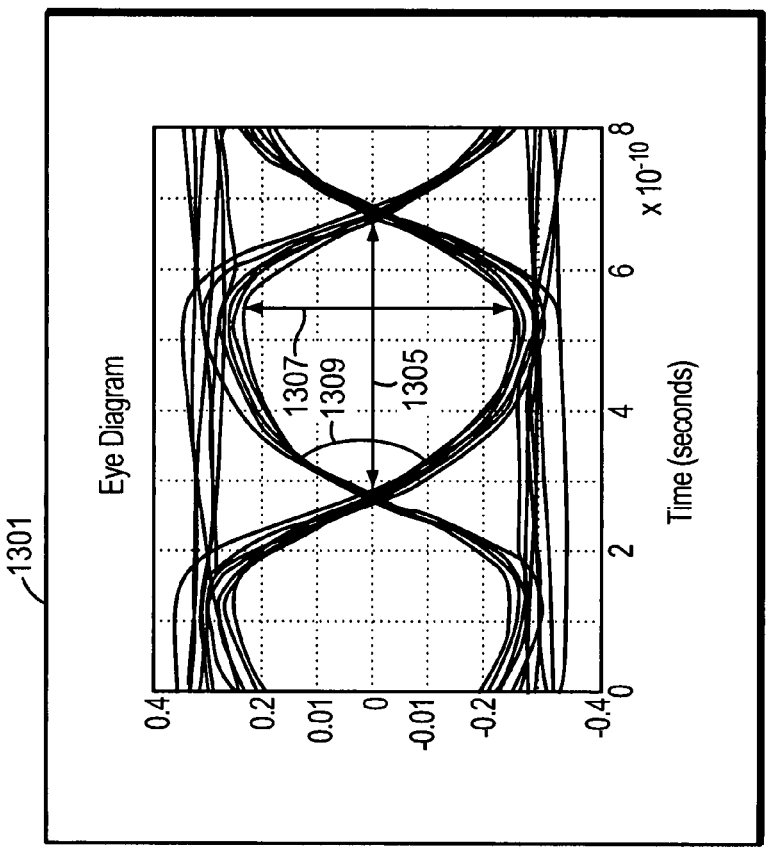

FIG. 13 displays simulation results 1301 (obtained using the differential amplifier of FIG. 3) and 1303 (obtained using the differential amplifier of FIGS. 5 and 6). The simulation results 1301 and 1303 were obtained using the parameters of FIG. 12 (3000 mV differential input and a zero volt common mode) and the addition of a +/−150 mV common mode noise. The eye diagram properties 1305, 1307, and 1309 of the differential amplifier 1303 display more desirable signal characteristics than that of the prior art amplifier 1301. The static jitter is approximately 19 ps (prior art 1301) compared to approximately 4 ps (amplifier 1303).

Figure 14:
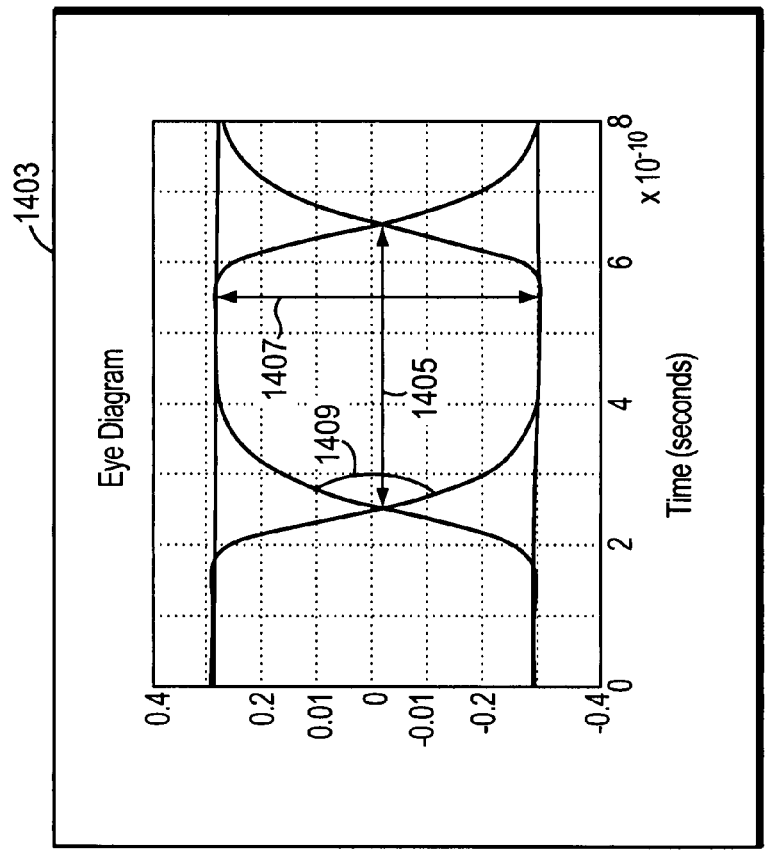
Figure 14:
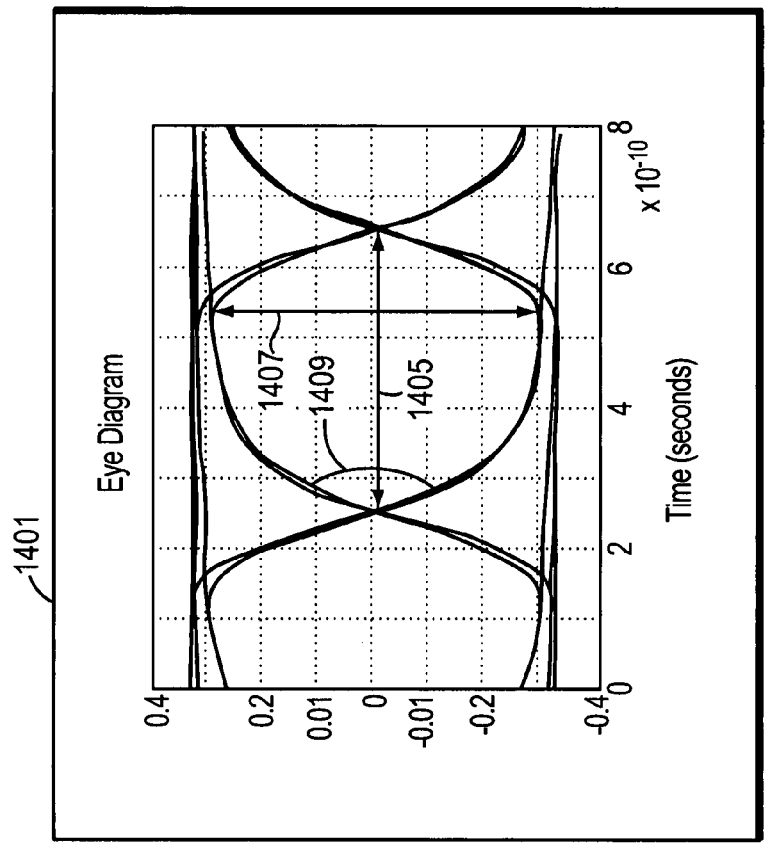

As a final test case, simulation results for a very large (600 mV) input signals are observed. FIG. 14 shows simulation results 1401 (obtained using the differential amplifier of FIG. 3) and 1403 (obtained using the differential amplifier of FIGS. 5 and 6) for a constant zero volt common mode, and a 600 mV differential amplitude input. The eye diagram properties 1405, 1407, and 1409 of the differential amplifier 1403 display more desirable signal characteristics than that of the prior art amplifier 1401. The prior art amplifier 1401 exhibits 6 ps of static jitter, while the amplifier 1403 is still static jitter free.

Figure 15:
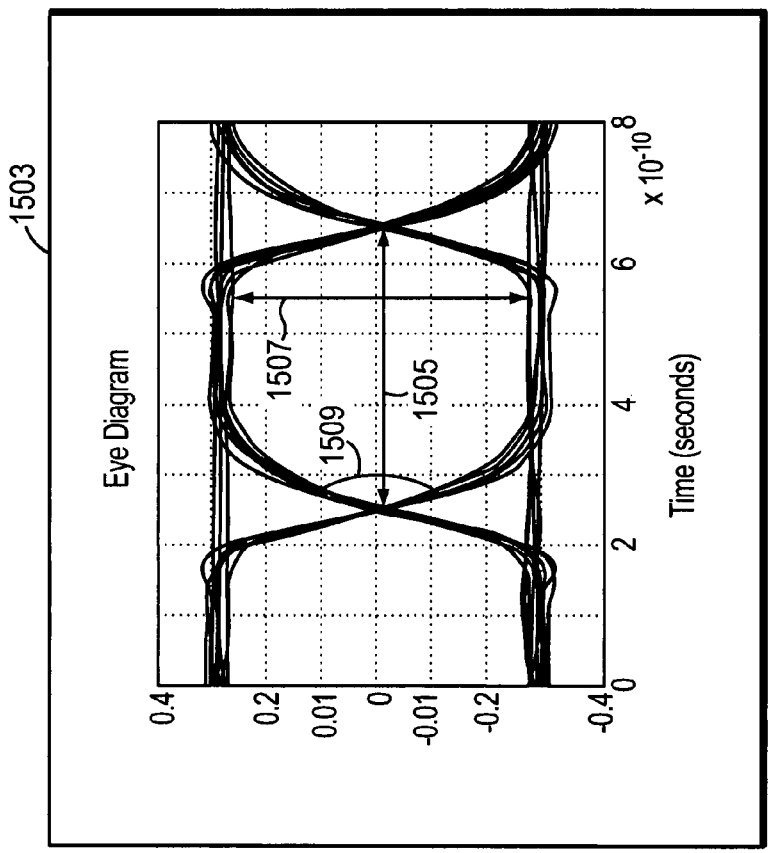
Figure 15:
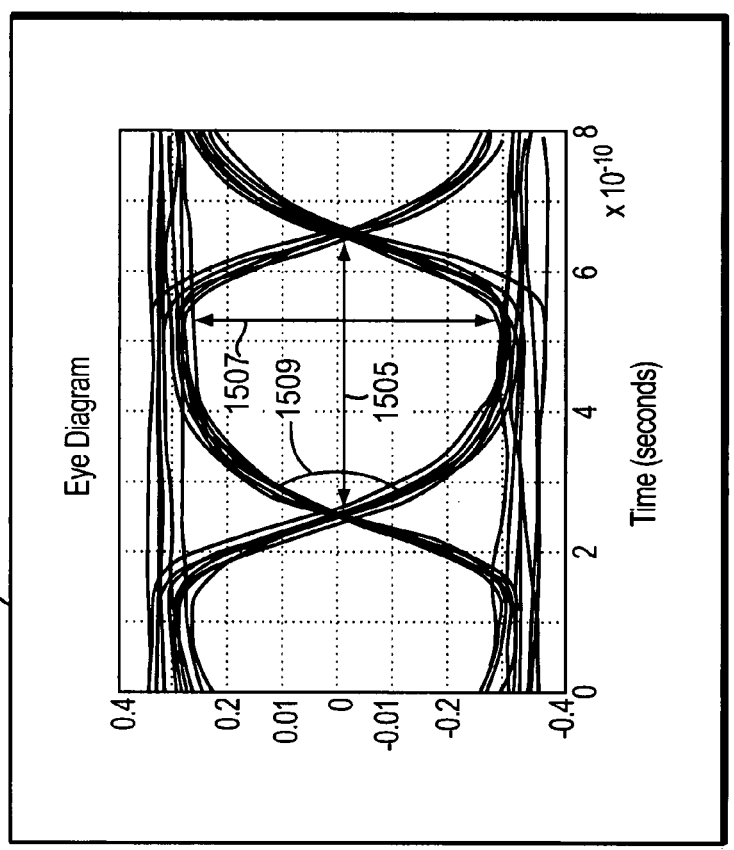

FIG. 15 displays simulation results 1501 (obtained using the differential amplifier of FIG. 3) and 1503 (obtained using the differential amplifier of FIGS. 5 and 6). The simulation results 1501 and 1503 were obtained using the parameters of FIG. 14 (6000 mV differential input and a zero volt common mode) and the addition of a +−150 mV common mode noise. The eye diagram properties 1505, 1507, and 1509 of the differential amplifier 1503 display more desirable signal characteristics than that of the prior art amplifier 1501. Additionally, the static jitter still significantly better in the amplifier 1503 (5 ps compared to 18 ps for prior art 1501).

Thus far, only differential outputs have been simulated, since the amplifier itself is differential. Differential signals may hide signal imperfections in the single ended components ($V_+$ or $V_-$) that make up the differential output ($V_+ - V_-$). Therefore it is useful to also look at the single ended signals ($V_+$ and $V_-$) individually to observe the improvement offered with the architecture of FIGS. 5 and 6.

Figure 16:
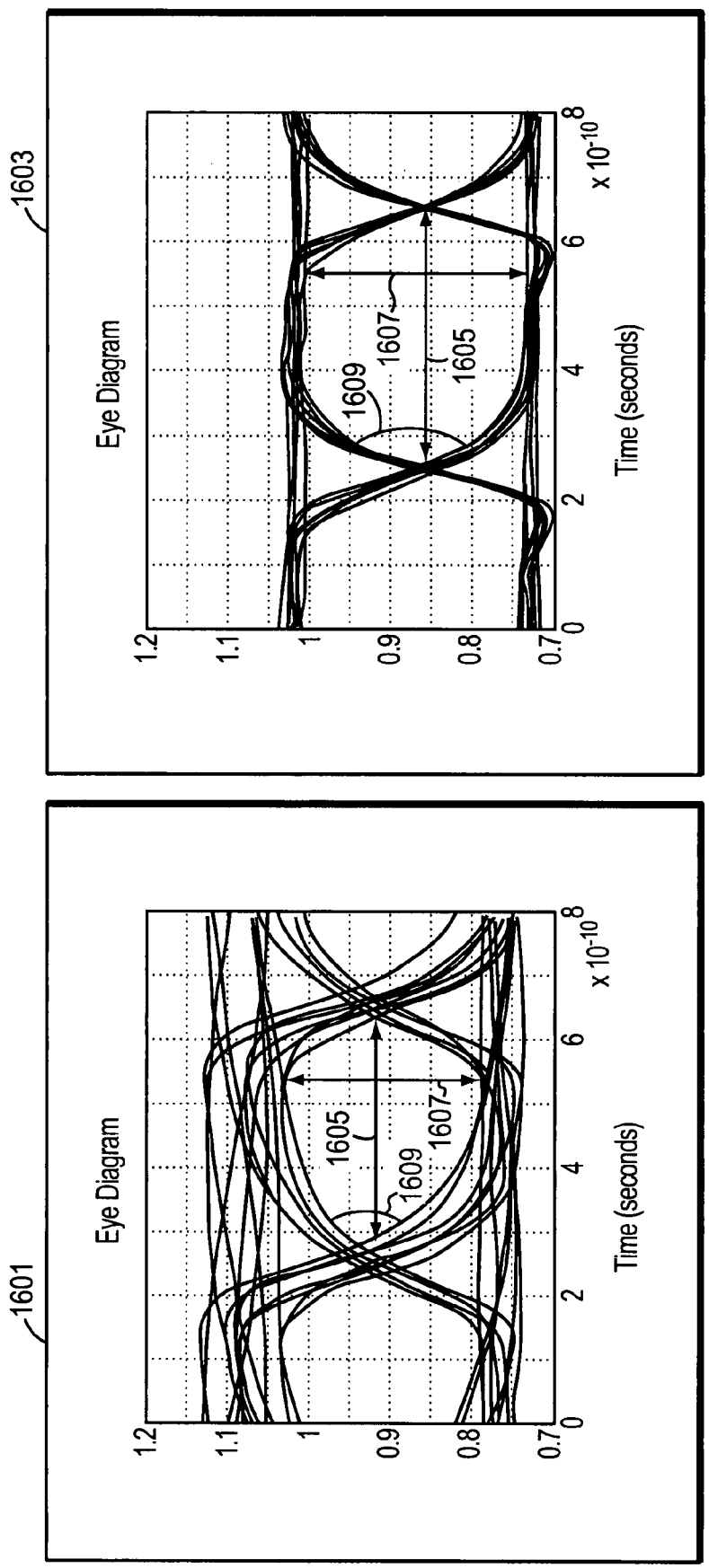

FIG. 16 shows the single ended results of the simulation corresponding to the differential results in FIG. 15, where the simulation result 1601 is obtained using the differential amplifier of FIG. 3, and the simulated result 1603 is obtained using the differential amplifier of FIGS. 5 and 6. In a comparison of simulated results 1601 and 1603, the advantage of the amplifier 1603 is even greater when examining the single ended outputs, as the amplifier 1603 displays more desirable output signal properties 1605, 1607, and 1609.

A novel differential amplifier has been described. The novel differential amplifier may be used in high speed serial links. The differential amplifier offers advantages over prior art amplifiers in that several highly desirable characteristics are made available simultaneously, and in one stage. These may include, but are not limited to: (1) high input impedance so that linear resistors can be used to terminate the channel, (2) a zero volt tolerant common mode input level, (3) tolerance of larger swings on the input at a zero volt level than prior art, (4) an output that is Vdd referenced, and (5) low distortion of the input resulting in improved eye diagrams for all input swings, and in the face of common mode noise.

It should be appreciated that the PMOS and NMOS transistors of the amplifier shown in FIG. 5 may be inverted, such that transistors $M_{15}$-$M_{17}$ are NMOS and transistors $M_{18}$-$M_{21}$ are PMOS. In this case, the amplifier would accommodate a common mode of $V_{dd}$, rather than zero volts, and the amplifier would produce an output referenced to ground. It should also be appreciated that the load resistors $R_L$ 533 may be replaced with a MOS load. Similarly, it should be appreciated that the current sources $M_{18}$ and $M_{19}$ may be replaced by resistors.

While this invention has been particularly shown and described with references to example embodiments thereof, it will be understood by those skilled in the art that various changes in form and details may be made therein without departing from the scope of the invention encompassed by the appended claims.

What is claimed is:

1. A differential amplifier comprising:
   an input sub-stage configured to accommodate a zero volt common mode input and provide a high input impedance; and
   a transistor sub-stage configured to resistively fold the input sub-stage forming a single stage using a resistive load, the resistive load configured to provide an output signal with a common mode referenced to an upper bound of an input power supply, the output signal having a non-inverting output and an inverting output.

2. The differential amplifier of claim 1 wherein the input sub-stage further comprises:
   a pair of input transistors; and
   a third transistor configured to supply a bias current.

3. The differential amplifier of claim 2 wherein the pair of input transistors and the third transistor are p-channel MOS transistors.

4. The differential amplifier of claim 3 wherein the pair of input transistors are configured to accommodate the zero volt common mode input without impacting the performance of the third transistor.

5. The differential amplifier of claim 1 wherein the transistor sub-stage further comprises a plurality of n-channel MOS transistors configured to supply a second biasing current source.

6. The differential amplifier of claim 1 wherein at least two transistors of the transistor sub-stage resistively fold the input sub-stage to output nodes, in a manner allowing the input to have a direct effect on the output signal.

7. A method of amplification comprising:
   receiving a zero volt common mode input signal while providing an amplifier high input impedance; and
   outputting an amplified output signal, with a common mode referenced to an upper bound of an input power supply, via a transistor sub-stage resistively folding an input sub-stage using a resistive load, the output signal having a non-inverting output and an inverting output.

8. The method of claim 7 wherein the input sub-stage further comprises a pair of input transistors and a third transistor supplying a bias current.

9. The method of claim 8 wherein the pair of input transistors and the third transistor are p-channel MOS transistors.

10. The method of claim 9 wherein receiving the zero volt common mode input signal is performed by the pair of input transistors without impacting the performance of the third transistor.

11. The method of claim 7 wherein transistor sub-stage further comprises a plurality of n-channel MOS transistors supplying a second bias current.

12. The method of claim 7 wherein resistively folding further comprises:
    supplying a bias current to the transistor sub-stage with use of the input sub-stage; and
    directly affecting the output signal via the bias current.

13. A differential amplifier comprising:
    an input sub-stage comprising;
    an input pair of p-channel transistors configured to accommodate a zero volt common mode input and provide a high input impedance; and
    a third transistor configured to supply a bias current;
    a transistor sub-stage resistively folding the input sub-stage forming a single stage using a resistive load, the transistor sub-stage further comprising:
    a first set of n-channel MOS transistors configured to receive the bias current through the resistive load; and
    a second set of n-channel MOS transistors configured to supply a second bias current, where the first and second set of n-channel MOS transistors are further configured to provide an output signal with a common mode referenced to an upper bound of an input power supply and the output signal directly affected by the input and having a non-inverting output and an inverting output.

14. A differential amplifier comprising:
    means for accommodating a zero volt common mode input and providing a high input impedance; and
    means for resistively folding using a resistive load configured to provide an output signal with a common mode referenced to an upper bound of an input power supply, the output signal having a non-inverting output and an inverting output.

15. The differential amplifier of claim 1 wherein the resistive load comprises two resistors.

16. The method of claim 7 wherein the resistive load comprises two resistors.

* * * * *